United States Patent [19]
Hefele

[11] Patent Number: 5,460,316
[45] Date of Patent: Oct. 24, 1995

[54] STENCILS HAVING ENHANCED WEAR-RESISTANCE AND METHODS OF MANUFACTURING THE SAME

[75] Inventor: Hermann L. Hefele, Augsburg, Germany

[73] Assignee: AT&T Global Information Solutions Company, Dayton, Ohio

[21] Appl. No.: 306,547

[22] Filed: Sep. 15, 1994

[30] Foreign Application Priority Data

Sep. 15, 1993 [GB] United Kingdom .................. 9319070

[51] Int. Cl.$^6$ .............................. B23K 3/00; B41M 1/28; C23C 16/26
[52] U.S. Cl. ................... 228/39; 228/248.1; 118/406; 101/127; 101/128.4; 427/249; 427/282
[58] Field of Search ............... 228/39, 215, 248.1, 228/248.5; 118/406; 101/127, 128.4; 427/249, 282

[56] References Cited

U.S. PATENT DOCUMENTS 4,299,164 11/1981 Jonkers ......................... 101/120
4,401,520 8/1983 Steppan et al. ..................... 204/11
4,953,460 9/1990 Wojcik ........................... 228/248.1

FOREIGN PATENT DOCUMENTS 93909 11/1972 Germany.

*Primary Examiner*—Samuel M. Heinrich
*Attorney, Agent, or Firm*—Craig E. Miller

[57] ABSTRACT

Stencils having enhanced wear-resistance consisting of a metal body, preferably fabricated from stainless steel, having a first major surface and a second major surface and a plurality of apertures extending through the metal body from the first major surface to the second major surface, and a diamond coating which is preferably applied to at least the top surface of the metal body, and to the side walls of the plurality of apertures. Such stencils are particularly useful for positioning solder paste in predetermined areas on contact pads of printing wiring boards. The diamond coating is preferably deposited on the stencil surfaces from a vapor phase of carbon-containing gases. By applying the diamond coating to the top and side wall surfaces of the stencil, improved wear-resistance is achieved, resulting in increased service life for the stencils.

26 Claims, 2 Drawing Sheets

STENCILS HAVING ENHANCED WEAR-RESISTANCE AND METHODS OF MANUFACTURING THE SAME

BACKGROUND AND SUMMARY OF THE INVENTION

The present invention relates generally to new and novel improvements in stencils having enhanced wear-resistance, and to methods of manufacturing the same. More particularly, the present invention relates to stencils which may be used, in one advantageous application, for printing solder paste onto the contact pads of printed circuit boards. Stencils in accordance with the present invention are also useful in other applications, including printing processes where the stencils are subjected to mechanical pressure.

Printed circuit boards designed to receive surface-mounted components are often provided with a plurality of contact pads on their surface. Surface-mounted components are mounted by way of connector leads on the individual surface-mounted component's body. In order to mechanically and electrically connect the connector leads of the components to the contact pads of the printed wiring board, the contact pads are typically provided with a layer of solder paste prior to placement of the connector leads thereon. Once the surface-mounted component has been positioned on the appropriate contact pads, the solder paste is melted and subsequently solidifies to form a mechanical and electrical connection between the connector leads of the surface-mounted component and the contact pads.

Metal stencils are often employed to apply the solder paste onto the contact pads. Such stencils typically have a plurality of apertures which are positioned in the stencil in a predetermined pattern to correspond with the pattern of contact pads on a particular printed circuit board.

In use, such stencils are positioned on the surface of the printed circuit boards having the contact pads upon which solder paste is to be applied. The apertures in the stencil are then aligned over the contact pads onto which solder paste is to be applied. Solder paste is then urged mechanically by, for example, a squeegee, across the upper surface of the stencil and through the apertures in the stencil. Islands of solder paste is thereby accurately located on the appropriate contact pads.

These types of stencils are commonly employed in high-volume production processes. However, one disadvantage of many known stencils is that the stencil quality deteriorates quickly due to damage caused by the mechanical pressure which is applied by the squeegee as it passes over the stencil surface and solder paste is urged into the apertures, and subsequently onto the contact pads. In particular, the edges at the junction between the upper surface of the stencil and the side walls of the apertures become rounded and generally damaged, thus leading to a reduction in the quality and definition of the resulting solder paste pattern. Thus, the useful service life of such known stencils is disadvantageously restricted.

Accordingly, an object of the present invention is to provide stencils having enhanced wear-resistance which are resistant to damage and capable of extended service life, and manufacturing methods for making the same.

Another object of the present invention is the provision of stencils having enhanced wear-resistance which can be used for applying solder paste onto contact pads of printed circuit boards and which are resistant to damage and capable of extended service life, and manufacturing methods for making the same.

These and other objects of the present invention are attained by the provision of a stencil having a metal body having first and second major surfaces, and at least one aperture passing through the body from the first major surface to the second major surface. In one preferred embodiment of the present invention, the side wall surfaces of the apertures and at least one of the first major surface and second major surface has a thin diamond coating thereon. Preferably, the diamond coating is applied as a thin film by a low pressure synthesis process.

It should be understood that the term diamond as used in the present description and claims refers to a transparent and hard synthetic carbon material having properties which resemble natural diamonds. Such materials are commonly known in the art as synthetic diamonds or diamondlike carbon.

Other objects, advantages and novel features of the present invention will become apparent in the following detailed description of the invention when considered in conjunction with the accompanying drawings.

DETAILED DESCRIPTION OF THE DRAWINGS

Figure 1:
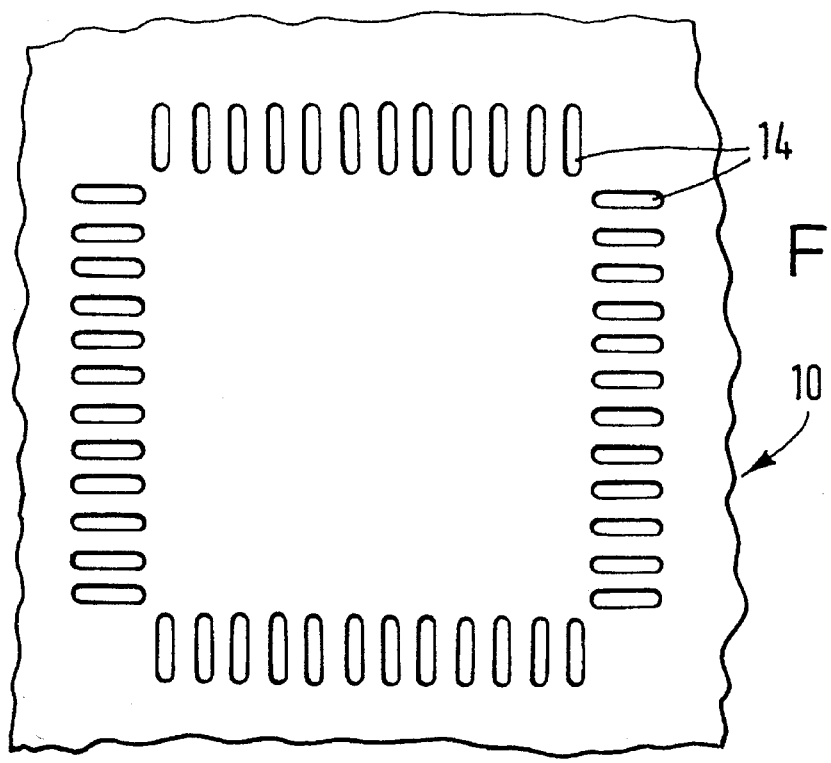
FIG. 1 is a plan view of a portion of a stencil having a pattern typical of that used for printing a solder paste pattern onto contact pads of a printed circuit board in accordance with the present invention.
Figure 3:
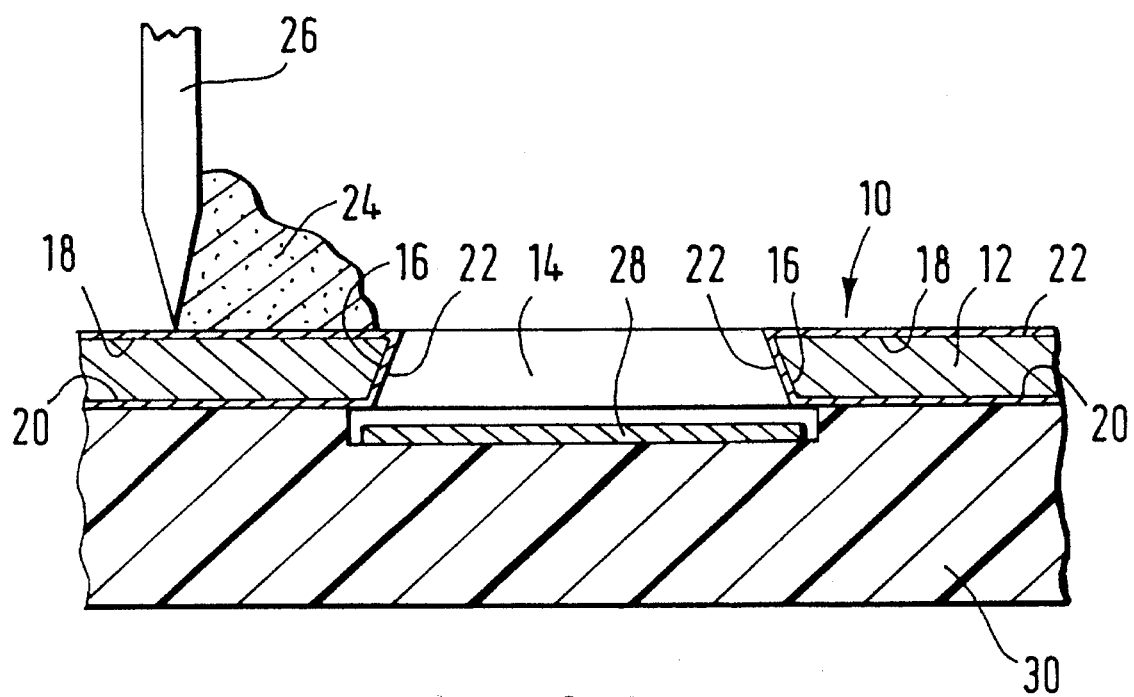
FIG. 3 is an enlarged cross-sectional view of a stencil in accordance with the present invention taken along the center line of one aperture, showing the diamond coating and the squeegee used for applying solder paste through the apertures of the stencil to the underlying contact pads of the printed circuit board.

Referring now to the drawings, in which like-referenced characters indicate corresponding elements throughout the several views, attention is first directed to FIG. 1 which illustrates a preferred embodiment of a stencil having enhanced wear-resistance, generally identified by reference numeral 10. Stencil 10 consists of body 12, preferably fabricated from stainless steel, having a plurality of apertures 14 provided therethrough, only one of which is shown in FIG. 3. Each aperture 14 is defined by side wall surfaces 16 which slope outwardly in a direction from the stencil's top surface 18 to its undersurface 20. In use, solder paste 24 is urged by means of squeegee 26 along top surface 18 and into apertures 14 so that an island of solder paste is formed in each aperture 14 and on corresponding contact pad 28 of printed circuit board 30. Each island of solder paste has a cross-section which corresponds to the cross-section of its associated aperture 14, and sloping sides 16 of aperture 14 assists in the removal of stencil 10 without disturbing the sides of the island of solder paste which remains on contact pad 28.

Referring now to FIG. 3, protective diamond coating 22 covers top surface 18 of stencil body 12 and also side wall surfaces 16 of each aperture 14 of stencil 10. Preferably, as shown in FIG. 3, the coating is applied also to undersurface 20 of stencil body 12 to ensure even contact with underlying circuit board 30 during printing operations.

Figure 2:
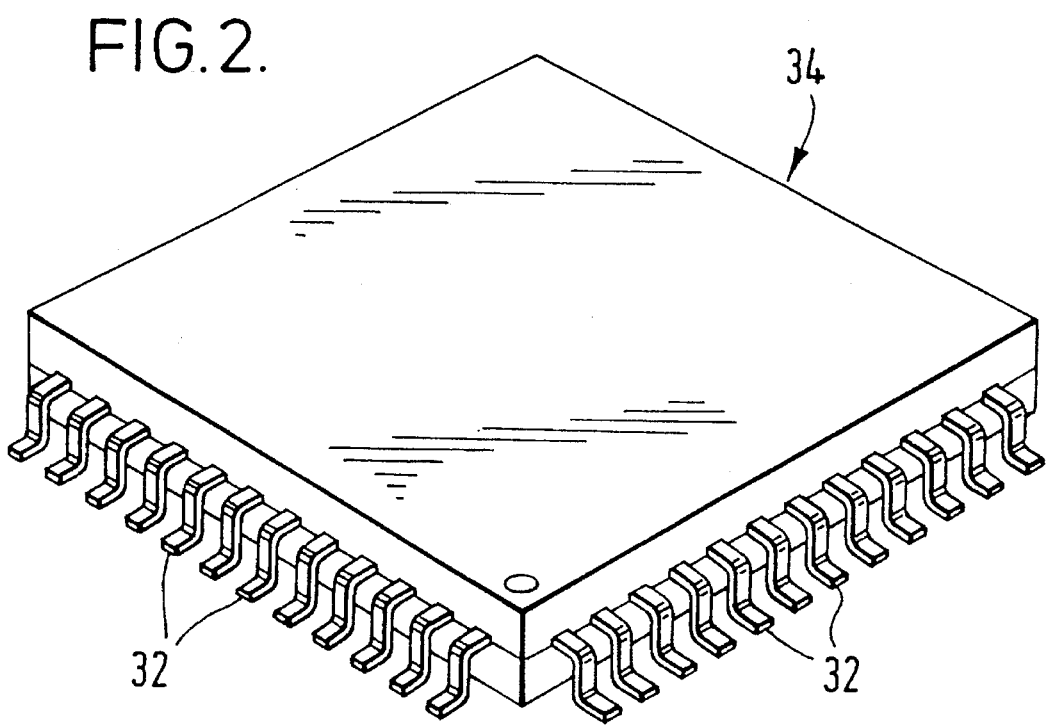
FIG. 2 is a perspective view of a typical component to be surface mounted onto the contact pads of a printed circuit board by means of solder paste printed over the contact pads through the apertures of the stencil shown in FIG. 1.

In a typical stencil in accordance with the present invention, the distance between the centers of adjacent apertures, i.e., the distance that corresponds to the distance between connector leads 32 of component 34 (see FIG. 2), or the so-called pitch, is preferably between 0.2 mm and 1.25 mm, and stencil body 12 preferably has a thickness of between 0.1 mm and 0.2 mm. The thickness of protective diamond coating 22 is preferably between 0.5 µm and 2 µm.

The material used for body 12 of stencil 10 is preferably metal and apertures 14 are fully etched or laser cut therein. In addition to stainless steel, other suitable metals or alloys which may be used for fabrication of stencil 10, include, for example, brass, copper, bronze, molybdenum and silver.

Protective diamond coating 22 is preferably deposited on the desired surfaces of stencil 10 from the vapor phase of carbon-containing gases. For example, a mixture of about 1% methane in hydrogen is heated by a tungsten wire mesh at 2200° C. and at a reduced pressure of 50 millibars so that the methane decomposes and more than 5% of the hydrogen dissociates into atoms. In this process, the temperature of the stencil surface is between 600° and 1050° C. The dissociated hydrogen prevents the deposition of graphite on the surface and protective diamond coating 22 is formed. In an alternative process, microwave radiation is directed at the 50 millibar gas mixture so as to form a glowing plasma which causes the decomposition of the methane, the dissociation of the hydrogen, and the formation of protective diamond coating 22.

These and other processes are further described in "Diamond Deposition Technologies" published by Elsivior Science Publishers B. V., Amsterdam, in "Diamond and Related Materials", 1 (1992) pages 1021–1034.

Protective diamond coating 22 greatly improves the wear-resistance of stencil 10 and the coated stencil does not suffer the damage and related disadvantages of known stencils, as discussed above. The useful service life of the coated stencil has been found to be at least three times that of known stencils, while at the same time providing printing consistency which is considerably improved.

In particular, protective diamond coating 22 on top surface 18 provides protection against pressures exerted by squeegee 26 as it moves solder paste 24 over top surface 18 into apertures 14, while protective diamond coating 22 on side wall surfaces 16 of apertures 14 protects side wall surfaces 16 from damage and combines with protective diamond coating 22 on top surface 18 to protect the edges formed at the junction between top surface 18 and side wall surfaces 16.

Although the present invention has been described above in detail, such explanation is by way of example only, and is not to be taken as a limitation on the present invention. Accordingly, the scope and content of the present invention are to be limited and defined only by the terms of the appended claims.

What is claimed is:

1. A stencil, comprising a body having a first major surface, a second major surface and at least one aperture extending through said body from said first major surface to said second major surface, said at least one aperture having a side wall surface, wherein said side wall surface of said at least one aperture and at least one of said first major surface and said second major surface have a diamond coating thereon.

2. The stencil in accordance with claim 1, wherein said side wall surface of said at least one aperture slopes outwardly in a direction from said first major surface to said second major surface.

3. The stencil in accordance with claim 1, wherein said stencil has a thickness of between 0.1 mm and 0.2 mm.

4. The stencil in accordance with claim 2 wherein said stencil has a thickness of between 0.1 mm and 0.2 mm.

5. The stencil in accordance with claim 1, wherein the thickness of said diamond coating is between 0.5 µm and 2 µm.

6. The stencil in accordance with claim 4, wherein the thickness of said diamond coating is between 0.5 µm and 2 µm.

7. The stencil in accordance with claim 1, wherein said second major surface also has said diamond coating thereon.

8. The stencil in accordance with claim 6, wherein said second major surface also has said diamond coating thereon.

9. A stencil for positioning solder paste in a predetermined pattern on contact pads of a printed circuit board, the stencil comprising a body having a first major surface, a second major surface and a plurality of apertures extending through said body from said first major surface to said second major surface, said apertures each having a side wall surface, wherein said side wall surfaces of said apertures and at least one of said first major surface and said second major surface have a diamond coating thereon.

10. The stencil in accordance with claim 9, wherein said side wall surfaces of said apertures slope outwardly in a direction from said first major surface to said second major surface.

11. The stencil in accordance with claim 9, wherein said stencil has a thickness of between 0.1 mm and 0.2 mm.

12. The stencil in accordance with claim 10, wherein said stencil has a thickness of between 0.1 mm and 0.2 mm.

13. The stencil in accordance with claim 9, wherein the distance between the center of adjacent apertures is between 0.2 mm and 1.25 mm.

14. The stencil in accordance with claim 12, wherein the distance between the center of adjacent apertures is between 0.2 mm and 1.25 mm.

15. The stencil in accordance with claim 9, wherein the thickness of said diamond coating is between 0.5 µm and 2 µm.

16. The stencil in accordance with claim 14, wherein the thickness of said diamond coating is between 0.5 µm and 2 µm.

17. The stencil in accordance with claim 9, wherein said second major surface also has said diamond coating thereon.

18. The stencil in accordance with claim 16, wherein said second major surface also has said diamond coating thereon.

19. The stencil in accordance with claim 9, wherein said body is fabricated from a stainless steel material.

20. The stencil in accordance with claim 18, wherein said body is fabricated from a stainless steel material.

21. The stencil in accordance with claim 9, wherein said apertures correspond with the contact pads of the printed circuit board.

22. The stencil in accordance with claim 20, wherein said apertures correspond with the contact pads of the printed circuit board.

23. A method of manufacturing a stencil, comprising the steps of:

providing a stainless steel body having a first major surface, a second major surface and at least one aperture extending through said body from said first major surface to said second major surface, said at least one aperture having a side wall surface;

applying a diamond coating to said side wall surface of said at least one aperture and at least one of said first major surface and said second major surface by a low pressure diamond synthesis process.

24. The method of manufacturing a stencil in accordance with claim 23, wherein said step of applying a diamond coating to said side wall surface of said at least one aperture and at least one of said first major surface and said second major surface by a low pressure diamond synthesis process consists of depositing said diamond coating from a vapor phase of carbon-containing gases.

25. The method of manufacturing a stencil in accordance with claim 23, wherein said step of applying a diamond coating to said side wall surface of said at least one aperture and at least one of said first major surface and said second major surface by a low pressure diamond synthesis process consists of depositing said diamond coating by a hot filament technique from a mixture of approximately 1% methane in hydrogen at a pressure of 50 millibars, using a tungsten wire mesh heated to approximately 2200° C.

26. The method of manufacturing a stencil in accordance with claim 23, wherein said step of applying a diamond coating to said side wall surface of said at least one aperture and at least one of said first major surface and said second major surface by a low pressure diamond synthesis process consists of depositing said diamond coating by directing microwave radiation at a mixture of approximately 1% methane in hydrogen at a pressure of 50 millibars so as to form a glowing plasma which causes decomposition of the methane, dissociation of the hydrogen and formation of said diamond coating.

\* \* \* \* \*